United States Patent
Johnson et al.

(10) Patent No.: US 9,753,461 B1
(45) Date of Patent: Sep. 5, 2017

(54) AUTONOMOUS AERIAL CABLE INSPECTION SYSTEM

(71) Applicant: Google Inc., Mountain View, CA (US)

(72) Inventors: David Wesley Johnson, Roswell, GA (US); Martin Brandt Freund, Cary, NC (US)

(73) Assignee: Google Inc., Mountain View, CA (US)

(*) Notice: Subject to any disclaimer, the term of this patent is extended or adjusted under 35 U.S.C. 154(b) by 0 days.

(21) Appl. No.: 15/092,824

(22) Filed: Apr. 7, 2016

(51) Int. Cl.
*G05D 1/00* (2006.01)
*B64C 39/02* (2006.01)
*B64D 45/00* (2006.01)
*B64D 47/08* (2006.01)
*G05D 1/10* (2006.01)

(52) U.S. Cl.
CPC ......... *G05D 1/0094* (2013.01); *B64C 39/024* (2013.01); *B64D 45/0005* (2013.01); *B64D 47/08* (2013.01); *G05D 1/0011* (2013.01); *G05D 1/101* (2013.01); *B64C 2201/12* (2013.01)

(58) Field of Classification Search
CPC .... G05D 1/0094; G05D 1/0011; G05D 1/101; B64C 39/024; B64C 2201/12; B64D 45/0005; B64D 47/08
See application file for complete search history.

(56) References Cited

U.S. PATENT DOCUMENTS

| 4,905,938 A | 3/1990 | Braccio et al. |
| 8,666,553 B2 | 3/2014 | Phillips et al. |
| 2013/0158711 A1 | 6/2013 | Smith et al. |
| 2015/0204480 A1* | 7/2015 | Lorimer .......... H02G 1/02 700/245 |
| 2016/0023761 A1 | 1/2016 | McNally |

FOREIGN PATENT DOCUMENTS

| CN | 105375398 A | 3/2016 |
| CN | 106099748 A | 11/2016 |
| CN | 205829037 U | 12/2016 |
| EP | 2983259 A1 | 2/2016 |
| FR | 3036992 A1 | 12/2016 |
| WO | 2011064565 A2 | 6/2011 |

OTHER PUBLICATIONS

Pagnano et al., "A Roadmap for Automated Power Line Inspection. Maintenance and Repair", 8th CIRP Conference on Intelligent Computation in Manufacturing Engineering, 2013, pp. 234-239.

(Continued)

*Primary Examiner* — Yuen Wong
(74) *Attorney, Agent, or Firm* — Lerner, David, Littenberg, Krumholz & Mentlik, LLP

(57) ABSTRACT

An aerial inspection system is provided, including an unmanned aerial vehicle (UAV) having an articulated arm coupled thereto. An end effector is coupled to a second end of the articulated arm, the end effector sized and shaped to extend at least partially around an aerial cable in close proximity. One or more sensors are positioned along an inner surface of the end effector, and provide feedback to a control unit. In response, the control unit adjusts a position of at least one of the UAV, the articulated arm, and the end effector such that the end effector maintains a close, non-contact position with respect to the cable.

12 Claims, 12 Drawing Sheets

(56) References Cited

OTHER PUBLICATIONS

Bahrami, M. R. "A novel design of electrical transmission line inspection machine." (2014), pp. 292-298.
Goncalves et al., Review and Latest Trends in Mobile Robots Used on Power Transmission Lines, International Journal of Advanced Robotic Systems, 2013, vol. 10.
Becker et al., Design of Mechatronic Systems to Inspect Power Transmission Lines and Towers, Speedam 2006 International Symposium on Power Electronics, Electrical Drives, Automation and Motion, Conference Paper Jun. 2006.
Yan et al., An Airborne Multi-angle Power Line Inspection System, 2007 IEEE, pp. 2913-2915.
Nayyerloo et al., Cable-Climbing Robots for Power Transmission Lines Inspection, Mobile Robots—State of the Art in Land, Sea, Air, and Collaborative Missions, 2009, pp. 63-84.
Elizondo et al., Overview of Robotic Applications for Energized Transmission Line Work—Technologies, Field Projects and Future Developments, 2010 1 International Conference on Applied Robotics for the Power Industry, Montreal, Canada, Oct. 5-7, 2010, 2010 IEEE.
Deng et al., Unmanned Aerial Vehicles for Power Line Inspection: A Cooperative Way in Platforms and Communications, Journal of Communications vol. 9, No. 9, Sep. 2014, pp. 687-692.
Gates, Brendan, A Power Line Inspector Device, Thesis Submitted in Partial Fulfillment of the Requirements for a Degree with Honors, University of Maine, May 2013.
St. John, Jeff, Are Flying Robots the Next Smart Grid Technology Ready to Take Off?, Jul. 23, 2014, Downloaded from <http://www.greentechmedia.com/articles/read/flyingrobotsforthesmartgrid>.
Bühringer et al., Cable-crawler—robot for the inspection of high-voltage power lines that can passivley roll over mast tops,Industrial Robot: An International Journal, vol. 37, Nov. 3, 2010, pp. 256-262.
Keemink, Arvid, Conceptual Investigations on a Manipulator System for Inspection UAVs, University of Twente, EEMCS/Electrical Engineering, Control Engineering, Mar. 2011, The Netherlands.
Phillips, A., Future Inspection of Overhead Transmission Lines, Electric Power Research Institute, May 2008.
Xu, Peng, Unified Dynamics and Control of a Robot Manipulator Mounted on a VTOL Aircraft Platform, Clemson University TigerPrints, Dissertation, Aug. 2014.
Wang et al., Development of a Practical Power Transmission Line Inspection Robot Based on a Novel Line Walking Mechanism, 2010 IEEE/RSJ International Conference on Intelligent Robots and Systems, Oct. 18-22, 2010, pp. 222-227, Taipei, Taiwan.
International Search Report and Written Opinion for PCT Application No. PCT/US2016/065157, dated Mar. 17, 2017. 12 pages.
Combined Search and Examination Report for UK Patent Application No. GB 1621151.8, dated Jun. 13, 2017. 5 pages.

\* cited by examiner

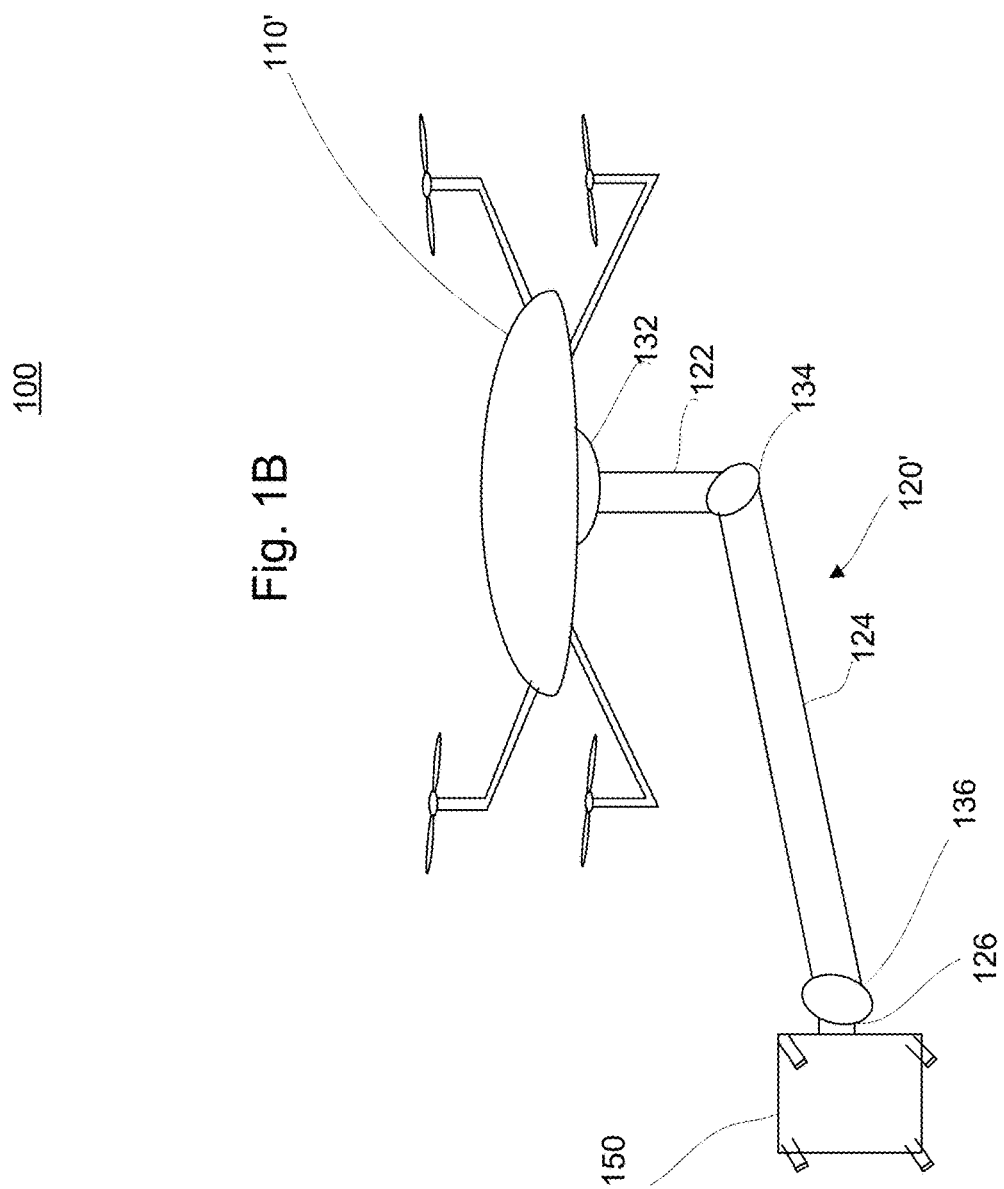

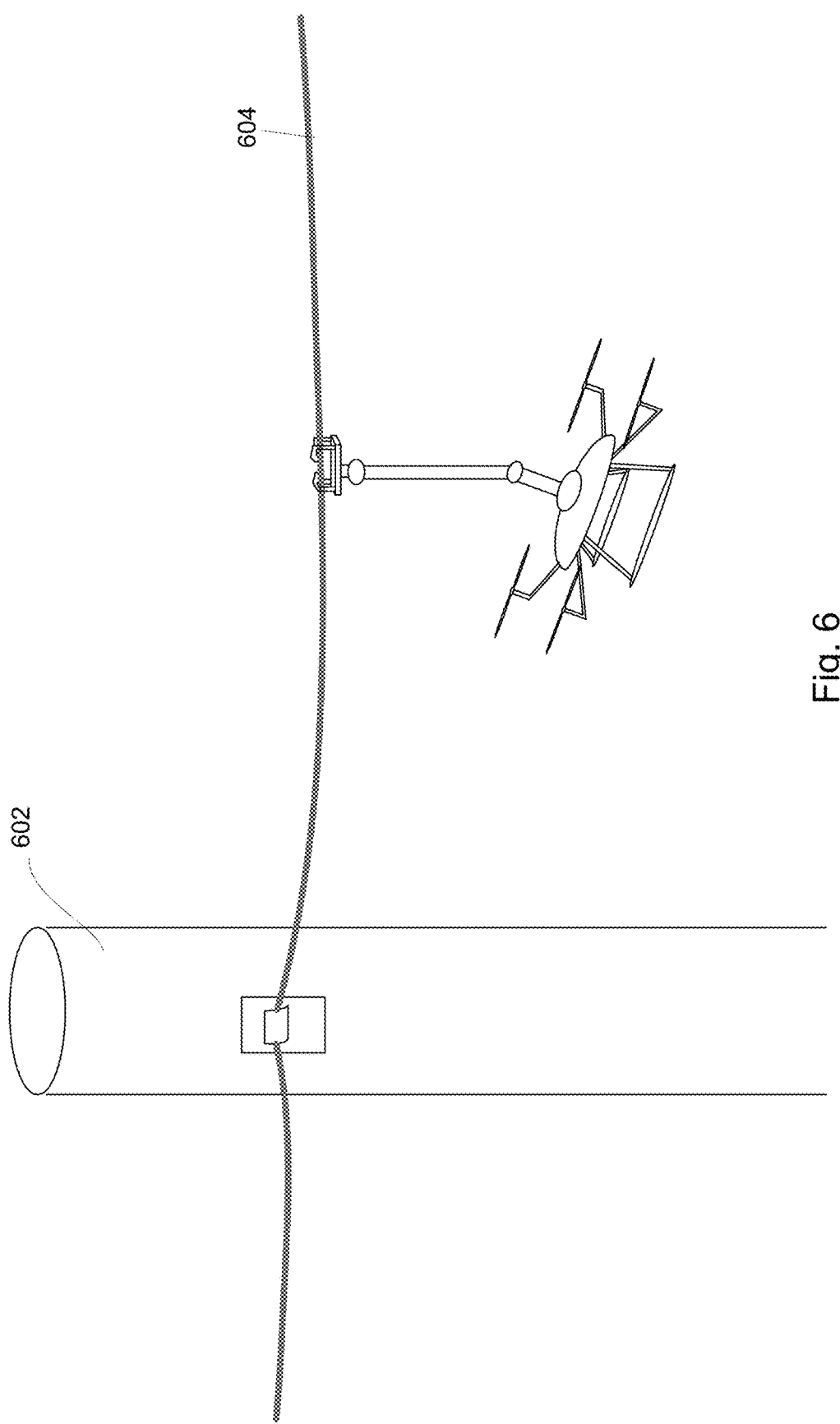

AUTONOMOUS AERIAL CABLE INSPECTION SYSTEM

BACKGROUND

Aerial cables, such as fiber cables, can become damaged by squirrel chew, fireworks, gun shots, weather, wear, etc. When this occurs, service provided through the aerial cables can be interrupted. Current methods of inspecting aerial fiber cable lines over long distances for sheath integrity or damage are slow, cumbersome and sometimes introduce unsafe practices or methods. As it is typically very difficult to locate where the cable is damaged and then repair it, service interruptions can be prolonged.

One of the largest issues in terms of cost and delays for fiber network deployment, operation, and maintenance is manual labor. Inspection of the aerial fiber cable is very labor intensive and often a costly undertaking. Another problem is safety. Many aerial workers are killed on the job every year, and many others suffer non-fatal loss of limbs from electrical burns and mechanical trauma.

BRIEF SUMMARY

One aspect of the disclosure provides aerial inspection apparatus, including an aerial vehicle, an articulated arm coupled to the aerial vehicle at a first end, and an end effector coupled to a second end of the articulated arm, the end effector sized and shaped to extend at least partially around an aerial cable, with one or more sensors positioned along an inner surface of the end effector. Further, a control unit in the apparatus is configured to receive information from the one or more sensors, and to adjust at least one of a position of the aerial vehicle, movement of the articulated arm, or movement of the end effector in response to information detected by the one or more sensors so as to maintain a predetermined relative position of the end effector with respect to the cable. The end effector may include a base plate, a first tong extending from an upper portion of the base plate, and a second tong extending from a lower portion of the base plate, wherein the one or more sensors and/or cameras are located along a length of each tong and the base plate. The cameras are adapted to capture a 360 view of the aerial cable. The control unit is configured to automatically maintain a non-contacting position of the one or more sensors in relation to the aerial cable.

Another aspect of the disclosure provides a system including one or more sensors, a memory, and one or more processors in communication with the one or more sensors and the memory. The one or more processors are configured to receive input from the one or more sensors, detect, based on the received input, a proximity between an end effector of an aerial vehicle and a cable, and adjust a position of the end effector with respect to the aerial cable in response to the received input, such that the end effector at least partially surrounds an outer diameter of the cable, and the outer diameter of the cable remains at a distance of approximately 1-100 mm from each surrounding portion of the end effector.

Yet another aspect of the disclosure provides a method, including continually receiving input from one or more sensors positioned on an end effector coupled to an unmanned aerial vehicle, the input corresponding to an aerial cable, detecting, with one or more processors, based on the received input, a proximity between the end effector and the aerial cable, and continually adjusting a position of the end effector with respect to the aerial cable in response to the received input, such that the end effector at least partially surrounds an outer diameter of the cable, and the outer diameter of the cable remains at a distance of approximately 1-100 mm from each surrounding portion of the end effector.

BRIEF DESCRIPTION OF THE DRAWINGS

FIGS. 1A-1B illustrate example aerial inspection systems according to aspects of the disclosure.

FIG. 6 illustrates the aerial inspection system of FIG. 1 in an example failsafe mode in relation to an aerial cable according to aspects of the disclosure.

DETAILED DESCRIPTION

Overview

Figure 1A:
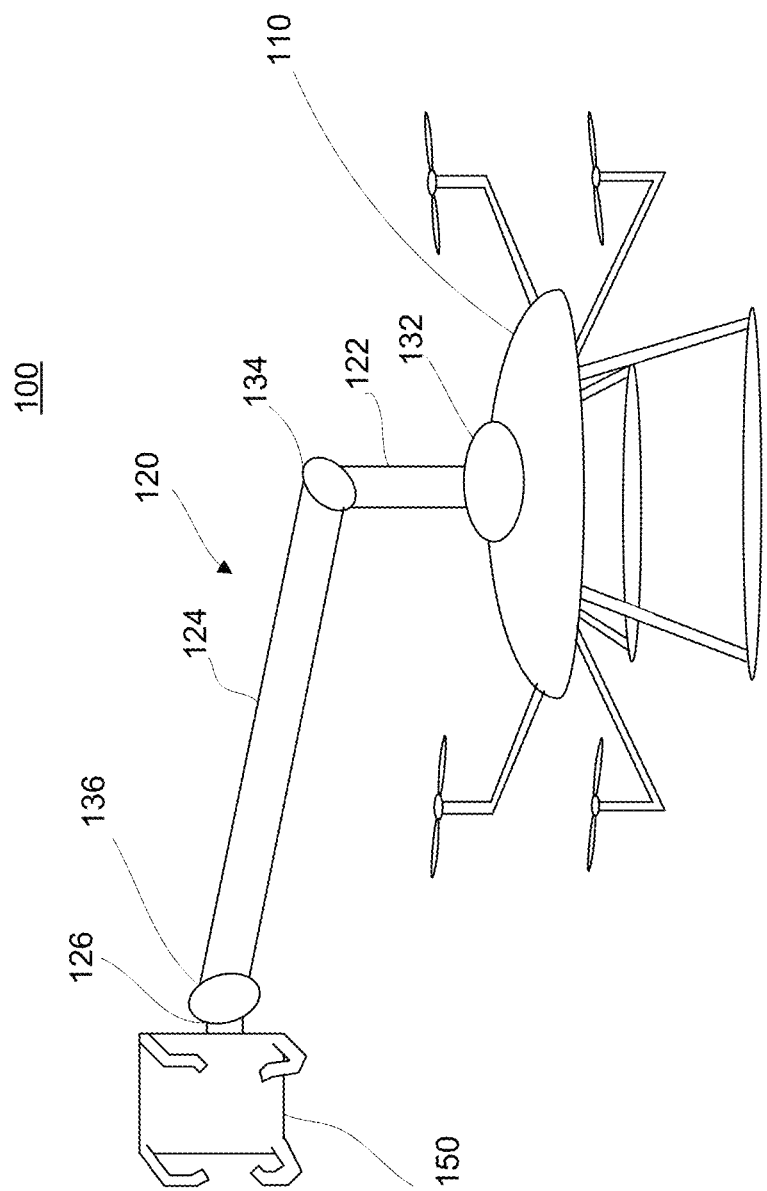

The technology relates generally to an unmanned aerial vehicle (UAV), such as a drone, adapted to closely inspect aerial cables. The aerial vehicle includes a lightweight articulated robotic extension arm, with an end effector adapted to maintain a fixed position with respect to the aerial cable. For example, the end effector includes one or more sensors which may provide real-time proximity feedback, stabilization control, and remote telemetry data. The end effector also includes one or more cameras adapted to capture a 360 degree image of the aerial cable.

The extension arm is made of lightweight material and is articulated with seven degrees of freedom, counterbalanced at each joint to enable smooth and efficient movement. In one example, it is outfitted with two 3-axis brushless DC gimbals, one at each end of the arm and a single-axis joint with brushless DC motor is located at approximately the midpoint of the arm (elbow joint). The articulation characteristics allow the arm to be stowed during navigated flight to and from an event location.

The 3-axis gimbal that is located at the end of the arm which attaches to the UAV allows the UAV to adjust its gyroscopic attitude (roll, pitch and yaw) independent of the arm's position, therefore allowing the arm and end-effector sensor array to remain stable in relationship and proximity to the target cable. Additionally, the arm provides a range of flexibility to accommodate for the UAV's linear flight characteristics and compensates for the UAVs linear (X, Y, and Z) attitude adjustments due to wind and general navigation requirements.

The end effector may be attached to the extension arm via the 3-axis brushless gimbal which is attached to a base plate of the end effector. A plurality of tongs protrude from the base plate. For example, four tongs may be positioned at approximately each corner of the base plate. The tongs may be positioned to move, such as by moving closer to or further away from one another. In this regard, the tongs may be positioned around cables or bundles of cables of different diameters, while still maintaining a consistent distance between the cable and the tongs.

A plurality of fiber cable facing cameras, lights, and opto-electromechanical sensors may be located along the length of each tong and the base plate. These cameras and sensors are adapted to evaluate the surface of the fiber cable and identify damage. For example, the cameras may capture information such as manufacturer information printed on a jacket of the fiber cable and damaged portions of the fiber cable. The device may use labels, quick response (QR) code, radio frequency identification (RFID), beacon Bluetooth low energy (BLE), or other types of markers to help identify or assist in identifying target cables. In addition, forward and rear facing cameras and sensors enable the UAV to avoid obstacles that are obstructing its flight path.

In some examples, the aerial vehicle may be outfitted with tools to clean or repair the cable. For example, the end effector may include a nozzle configured to aim compressed air and/or water mist onto the targeted cable to clear various debris, such as dust, dirt, mud, snow, etc., that may be present on the cable and preventing clear inspection of the cable surface.

The aerial vehicle may also be outfitted with a failsafe mechanism. For example, the end effector may be configured to latch onto the aerial cable in response to a predetermined event. Such predetermined events may include, for example, detection of a sudden unexpected position change, a position change outside of prescribed limits, contact with another object, etc.

A control unit of the aerial vehicle may include, for example, a microcontroller programmed to control movement of the extension arm and end effector. For example, the control unit may continuously detect a position of the aerial vehicle and a position of the end effector with respect to the cable. In response, the control unit may adjust the position of the end effector. It may also adjust a position of the aerial vehicle. The control unit may also include GPS navigation and a communication unit, such as RF transceivers.

The aerial vehicle may be used for any of a number of implementations. For example, the aerial vehicle may inspect cables in response to network outages or as part of routine maintenance. In this regard, the aerial vehicle may quickly and safely obtain information relating to a condition of the cable, pinpointing areas where damage has occurred. In such instances, information detected by the aerial vehicle may also be used to quickly repair the cable, such as by communicating the type of damage and manufacturer information of the damaged cable to technicians.

Examples Systems

FIG. 1A illustrates an example aerial cable inspection system 100. The aerial inspection system includes an unmanned aerial vehicle (UAV) 110, with an articulated robotic extension arm 120 coupled thereto. At an opposite end of the arm 120 is an end effector 150. The end effector 150 includes one or more sensors or cameras used to closely inspecting aerial cables, as discussed in further detail herein.

The extension arm 120 is made of lightweight material, such as polyethylene, aluminum, carbon fiber, or any other durable lightweight material. The arm 110 may be articulated with seven degrees of freedom, or more or less. In this example, the arm 120 includes segments 122, 124, and 126, which are connected to each other by joints 132, 134, 136. The arm 120 may be counterbalanced at each joint to enable smooth and efficient movement. According to one example, the joints 132 and 136 are 3-axis brushless DC gimbals, and the joint 134 is a single-axis joint with brushless DC motor. In other examples, different types of joints may be used. Further, the number of segments 122-126 and joints 132-136 may be modified. The articulation characteristics allow the arm 120 to be stowed during navigated flight to and from an event location.

The joint 132 which attaches the arm 120 to the UAV 110 allows the UAV 110 to adjust its gyroscopic attitude independent of the arm position. For example, the arm 120 may be moved without adjusting the roll, pitch and yaw of the UAV 110, and vice versa. In this regard, the arm and end-effector sensor array may remain stable in relationship and proximity to the target cable. The arm 120 also provides a range of flexibility to accommodate for linear flight characteristics of the UAV 110. Moreover, the arm 120 can compensate for linear attitude adjustments of the UAV 110 in the X, Y, and Z direction due to wind and general navigation requirements.

The joint 136 which attaches the arm 120 to the end effector 150 enables a broad range of movement of the end effector 150 independent of the UAV 110.

While FIG. 1A illustrates the arm 120 extending from an upper portion of the UAV 110, it should be understood that the arm 120 may be connected to the UAV 110 at any point. For example, referring to FIG. 1B, arm 120' is coupled to an underside of UAV 110'. Placing the joint 132 which connects the arm 120' with the UAV 110' near a center of gravity of the UAV 110' may provide stabilization, thereby allowing for accurate maneuvering of the UAV 110' and positioning of the end effector 150.

Figure 2A:
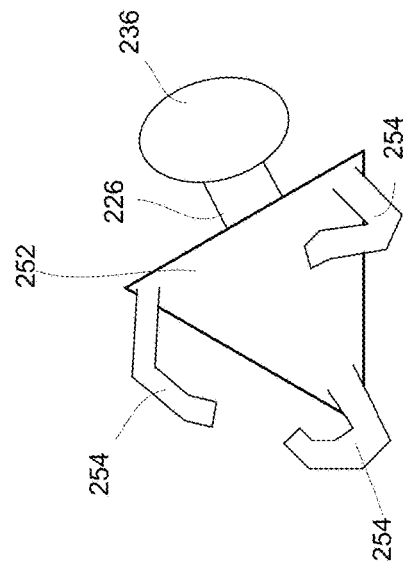
FIGS. 2A-2D illustrate example end-effectors according to aspects of the disclosure.

FIG. 2A provides a more detailed view of the end effector 150. In this example, the end effector 150 includes a base plate 152, with four tongs 154 extending from a position near each corner of the base plate 152. The tongs 154 and base plate 152 may each have one or more cameras, light emitting diodes (LEDs), and/or sensors located thereon, as described in further detail below in connection with FIGS. 3-4.

According to some examples, each tong 154 may have multiple segments connected by joints, such that each tong is articulated 154. Movement of such tongs 154 may be effected using one or more motors, such that the tongs 154 operate in concert or independently. In other examples, the tongs 154 may be fixed. As shown, the tongs 154 are generally curved. In this regard, an end point of each tong 154 opposite the base plate 152 may extend towards an opposing side of a cable from the base plate 152, thereby permitting close inspection of the cable from multiple angles at one time. In other example, the tongs 154 may extend straight out from the base plate 152 while still achieving the same effect.

In some examples each tong 154 may be generally the same size and shape and have the same construction. In other examples, however, the size and shape of the tongs 154 may vary from one tong to the next, and/or the construction of the tongs 154 may vary from one tong to the next. By way of example only, upper tongs may be wider, longer, and articulated, while lower tongs are shorter, thinner, and rigid.

While the base plate in FIG. 2A is shown as being generally flat and rectangular, the size and shape of the base plate may be varied. For example, the base plate 152 may be curved so that upper and lower portions extend away from segment 126 and joint 136, or so that each corner extends further away from the segment 126 and joint 136 and towards tongs 154. Moreover, the base plate 152 and tongs 154 may be formed as one continuous piece.

Figure 2B:
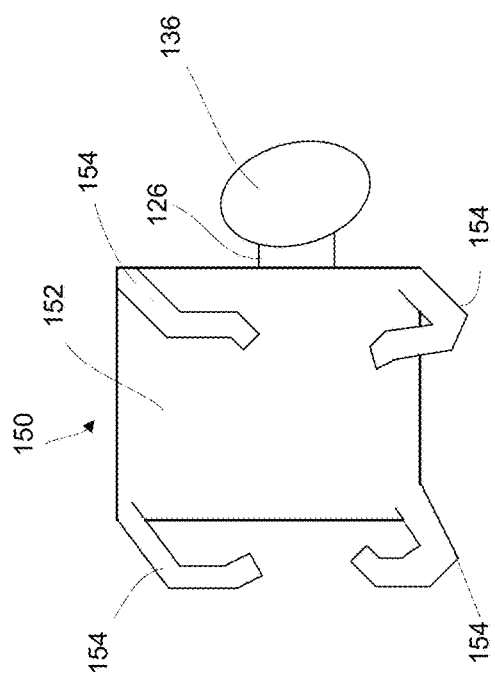

FIG. 2B illustrates another example end effector, including a generally triangular shaped base plate 252 and three tongs 254 positioned near each corner. The base plate 252 may be rotated by joint 236 to adjust the tongs 254. For example, while the end effector is shown as having one tong at an upper portion and two tongs at a lower portion, the base plate 252 may be rotated at the joint 236 such that two tongs are positioned at the upper portion.

Figure 2C:
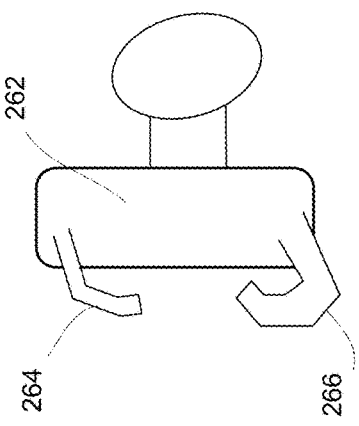

FIG. 2C illustrates yet another end effector. In this example, base plate 262 is narrower as compared to the base plate 152 of FIG. 2A. Further, two tongs 264, 266 are coupled to the base plate 262, with one at each end. As shown, upper tong 264 is sized differently than lower tong 266. However, as discussed above, the tongs may have any size, shape, or configuration, whether similar to each other tong or different.

Figure 2D:
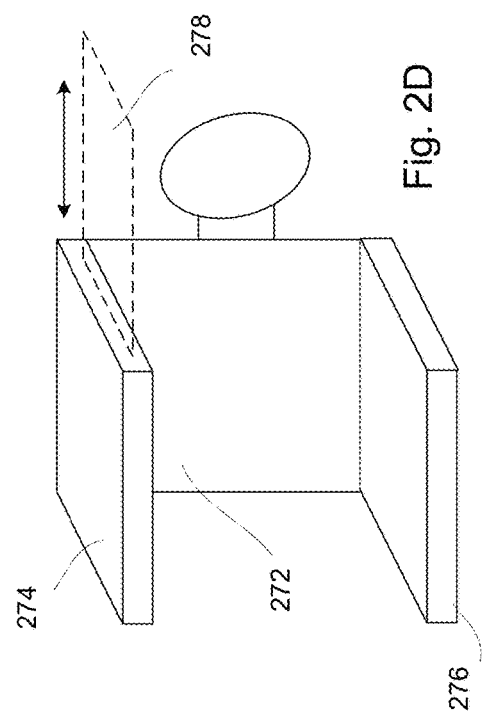

FIG. 2D illustrates a further example end effector. Here, the end effector inclues a base plate 272, and tongs 274, 276 which laterally across the base plate 272. Each of the tongs 274, 276 may include a plurality of sensors and/or other components on an inner surface thereof. The thickness and other dimensions of the tongs 274, 276 may vary, just as the structure may vary. By way of example only, each tong 274, 276 may be a solid and continuous piece of material, or may be narrower strips of material fused together with spaces therebetween. According to one example, a shade 278 may extend outward from one or more of the tongs 274, 276, and may be retracted when not needed. In this regard, if a glare from the sun or any other environmental factors are interfering with readings from the sensors on the end effector, the shade 278 may be deployed to shield such environmental factors. The shade 278 may be automatically controlled, such as by a motor activated by one or more processors, or it may be manually extended and retracted. While only one shade 278 is shown as extending from one side of the upper tong 274, it should be understood that similar shades may be incorporated into any or each side of any or each tong 274, 276.

In each of FIGS. 2A-2D described above, the end effectors have a generally C-shaped or U-shaped cross-section, though other configurations are possible which still provide for capture of 360 degree cable imagery.

Figure 3:
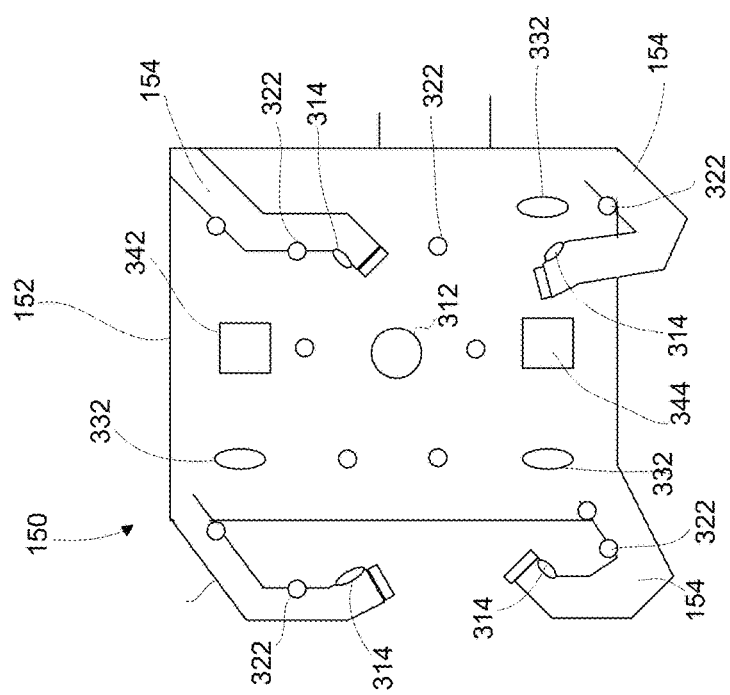
FIG. 3 illustrates example sensor placement on the end-effector according to aspects of the disclosure.

FIG. 3 illustrates an example of components positioned on the end effector 150. Such components may include image capture devices, LEDs, sensors, etc. The image capture devices may include, for example, cameras, infrared imagers, radar, sonar, ultrasound, or any other type of image capture device. The sensors may be opto-electromechanical sensors, electromagnetic sensors, sonic sensors, optical sensors, proximity sensors, light sensors, thermal sensors, organic sensors, gas/fluid sensors, or a combination of these or any other type of sensors. Other components positioned on the end effector may include, but are not limited to, RFID readers, bar code scanners, BLE or other wireless pairing devices, etc. Even further, cleaning tools may be incorporated into the end effector to clean dirt and debris from a cable, and thereby enable information on a jacket of the cable to be read. For example, the end effector 150 may be configured to aim compressed air or water onto the cable to clear away dust, dirt, mud, snow, bird droppings, or any other type of debris.

The image capture devices, sensors, lights, and other components may be positioned in various locations along the base plate 142 and the tongs 154. In the example of FIG. 3, cable-facing image capture device 312 is located on the base plate 152 and additional cable-facing image capture devices 314 are positioned on each tong 154. The image capture devices 312, 314 may capture images of an entire outer diameter of the cable at once. Forward and rear-facing image capture devices (not shown) may also be positioned on the end effector 150. Such forward and rear-facing image capture devices may provide information regarding obstacles, such as utility poles, trees, animals, etc., ahead of or behind the end effector. Further image capture device may similarly be positioned on the UAV.

Sensors 322 are also positioned on the base plate 152 and the tongs 154. According to one example, the sensors 322 include a variety of sensor types, such as some proximity sensors, some heat sensors, some electromagnetic field (EMF) detectors, etc. According to another example, the sensors 322 may include a plurality of sensors of the same type. The number of sensors and positioning of the sensors along the base plate 152 and tongs 154 may be varied. Further, the positioning of the sensors 322 in relation to other components, such as the image capture devices 312, 314 and lights 332, may be modified. According to some examples, the sensors that are selected for use in the end effector may be capable of receiving readings nothwithstanding environmental conditions. For example, sensors may be selected which can received feedback in near or total darkness, without the use of lights.

In other examples, lights 332 may also be positioned at various portions of the end effector 150, including the base plate 152 and/or the tongs 154, and the type, size, number, position, etc. may be varied. For example, the lights 332 may include LEDs, lasers, or any other type of illumination. The lights may be positioned so as to efficiently illuminate the cable without creating glare. In this regard, the aerial inspection system may continue inspecting cables even in conditions of near or total darkness.

Cleaning components 342, 344 may be positioned on the end effector, and their type, number, and position may also vary. For example, the end effector may include one or more of a compressed air nozzle, a water or solution sprayer, etc. In other examples, one or more of the tongs 154 may include a surface having a cloth or brush thereon to gently wipe away debris.

Figure 4A:
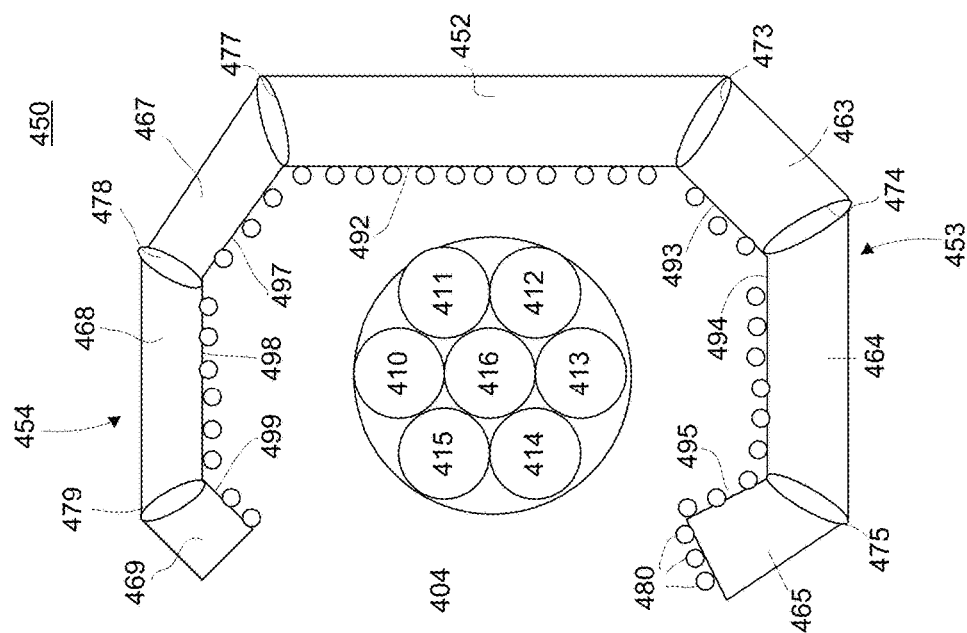
FIGS. 4A-4B are side views of example end-effectors in relation to one or more cables according to aspects of the disclosure.

FIG. 4A is a side view of an example end effector 450 in relation to a cable bundle 404 being inspected. The bundle is shown as including seven cables 410-416, but any number of cables can be accommodated by the end effector 450. The bundle 404 may be secured within an outer jacket, or each cable 410-416 may only be protected by its own jacket. As shown, the end effector 450 includes a base 452, such as a base plate or segment, a lower tong 453, and an upper tong 454. In this example, each tong 453, 454 includes a plurality of segments coupled by joints. For example, lower tong 453 includes segments 463-465 coupled by joints 473-475, and upper tong 454 includes segments 467-469 coupled by joints 477-479. Together, the base 452 and the tongs 453, 454 substantially surround an outer diameter of the bundle 404. Moreover, each segment and the base has an inner surface 492-499, where the inner surfaces 492-499 are maintained within a predetermined proximity of the outer diameter of the bundle 404. For example, each inner surface of the end effector 450 may remain within a distance of between 1 mm-100 mm, or more, of the cable bundle 404. The inner surfaces 492-499 also include a plurality of components 480, such as the LEDs, sensors, image capture devices, cleaning components, etc. described above in connection with FIG. 3. One or more of the components 480 provides feedback regarding the bundle 404 to a computing device.

For example, the sensors may report a distance between themselves and a closest point on the outer diameter of the bundle 404. This information may be used by the computing device to adjust a position of the end effector 450 as a whole, or to adjust a position of a particular tong 453, 454 or segment 463-465, 467-469.

While in the illustration of FIG. 4A the components 480 extend beyond the inner surfaces 492-499 of the end effector 450, in other examples the components 480 may be flush with the inner surfaces, such as by being at least partially recessed within the base 452 and segments 463-469, by being surrounded by additional material, etc. Moreover, the number, type, size, positioning, distribution, etc. of the components 480 may be varied.

Figure 4B:
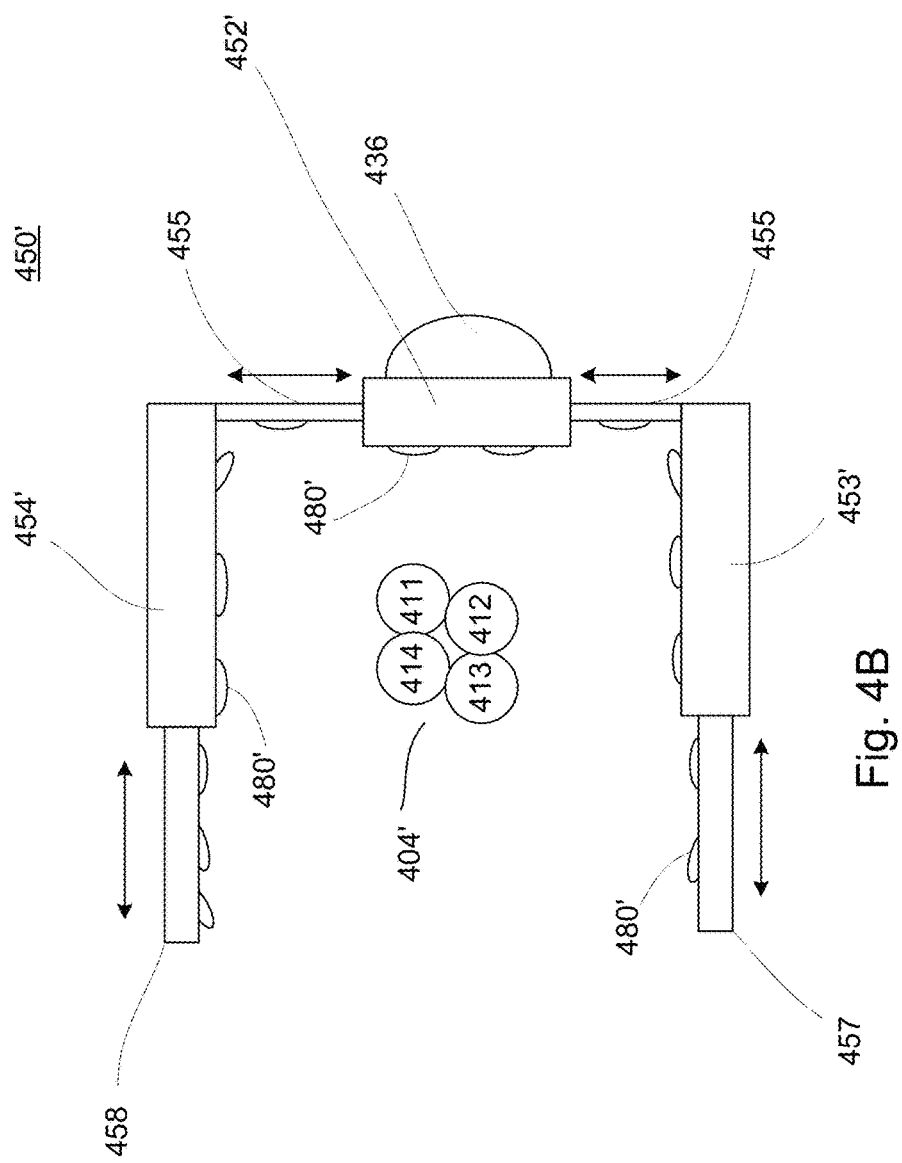

FIG. 4B provides another example of an end effector 450', shown in relation to cable bundle 404', which includes cables 411-414. In this example, base plate 452' is coupled to tongs 453', 454' via extensions 455, which may retract or extend. As such, the tongs 453', 454' may be moved closer together or farther apart. Such movement may be effected manually or mechanically. In some examples, movement of the extensions 455 may be automatic, such that a control unit moves the extensions 455 in response to feedback from one or more sensors.

In addition to the extensions 455, one or each of the tongs 453', 454' may also extend outwards in a direction substantially parallel with an axis of the tong 452', 454'. For example, appendage 457 may extend from tong 453', and appendage 458 may extend from tong 454'. When retracted, the appendages 457, 458 may be stored within their respective tongs 453', 454'.

Sensors/components 480' may be positioned on each inner surface of the end effector, including an inner surface of the base plate 452', extensions 455, tongs 453', 454', and appendages 457, 458. According to some examples, these sensors or other components may be positioned at an angle. The angling may focus the sensors 480' towards a position of the cable bundle 404'. For example, the sensors may be fixed at an angle which is set towards a desired position of the cable, such that sensors on the inner surfaces of the tongs are angled away from the base plate 452' where those sensors reside closer to the base plate, and are angled toward the base plate 452' where those sensors are positioned on a distal end of the tong 453', 454' or appendage 457, 458. According to other examples, an angling of the sensors may be adjustable, either manually or mechanically. The angling enables the sensors to receive feedback from each angle around the cable. For example, where the sensors include image capture devices, for example, images may be captured of an entire periphery of the cable bundle 404'.

Figure 5A:
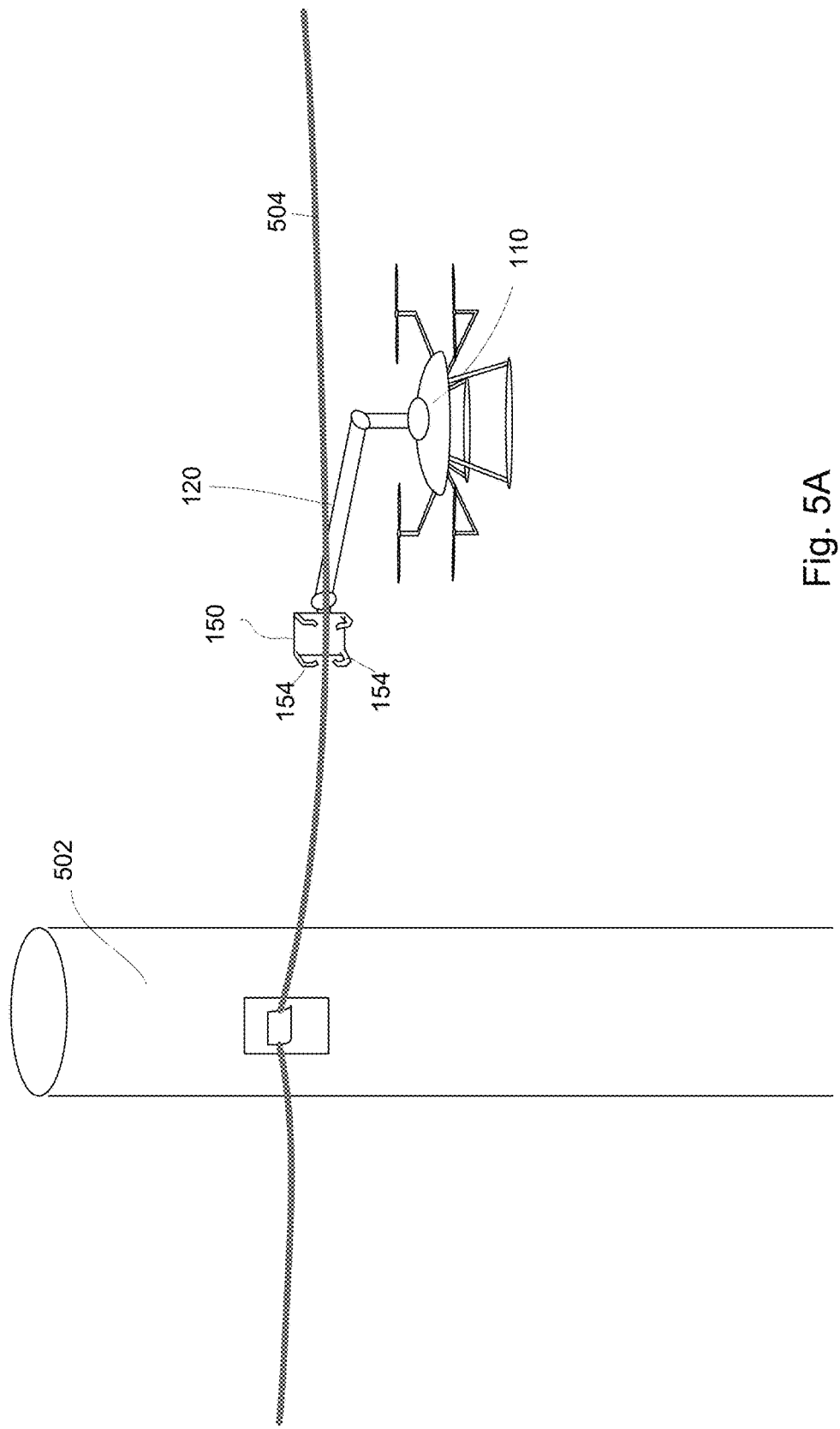
FIGS. 5A-5B illustrate examples of the aerial inspection system of FIG. 1 inspecting aerial cables according to aspects of the disclosure.

FIG. 5A illustrates an example of the aerial inspection system 100 inspecting a stretch of aerial cable 504, the cable supported by pole 502. The end effector 150 remains in close proximity to the cable 504, with the tongs 154 of the end effector 150 stretching around the cable. For example, as shown two of the tongs 154 stretch over a top of the cable 504, and two of the tongs 154 stretch under the bottom of the cable 504. The sensors on the end effector 504 continue to detect a position of the cable in relation to the end effector. The positioning of the end effector 150 may be adjusted in response. For example, any of the UAV 110, the arm 120, the end effector 150, or a combination thereof may be adjusted so that the end effector remains in close proximity to the cable 504.

As the aerial inspection system 100 inspects the cable 504, it may capture images or perform other operations. For example, the aerial inspection system 100 may continually capture images of the cable 504, and transmit those images to a remote computing device for review. The remote computing device may be, for example, a handheld controller manipulated by a ground operator, a centralized server, or any other of computing device. The images may include metadata, such as timestamps, corresponding GPS coordinates, etc. In this regard, an operator may review the images, identify a damaged portion of the cable in the images, and determine a location of the damage.

In other examples, the aerial inspection system 100 includes a computing device configured to identify damaged portions of cable and report the damage to a remote computing device. For example, the aerial inspection system computing device may use image recognition techniques to identify damaged cable, and to further determine a type of the damage. By way of example only, the aerial inspection system computing device may store a plurality of images of cable damage in association with other information, such as information identifying the type of damage. The aerial inspection system computing device may then compare the images captured by the end effector 150 with the stored images to determine whether any objects in the captured images match objects in the stored images.

The positioning of the image capture devices on the end effector 150 allow 360 degree images of the cable 504 to be captured as the aerial inspection system 100 moves along. As such, an entire outer diameter of the cable 504 may be inspected in a single pass, thereby providing for efficient inspection. In addition to identify damage, the aerial inspection system can identify other pertinent information from the cable 504, such as by reading manufacturer information printed on a jacket of the cable 504.

According to some examples, some of the tongs may be used to maintain positioning of the end effector in close proximity to the cable 504, while other tongs are used to capture images of the cable 504. For example, a forward upper tong and a forward lower tong may include one or more sensors which determine a distance between the cable 504 and the sensors. These sensors may provide the information to a computing device, as discussed above to allow for adjustment of the positioning of the end effector with respect to the cable as needed. In this same example, a rear upper tong and a rear lower tong may include one or more image capture devices, used to capture 360 degree images of the cable as the UAV 110 and end effector 150 move along.

Figure 5B:
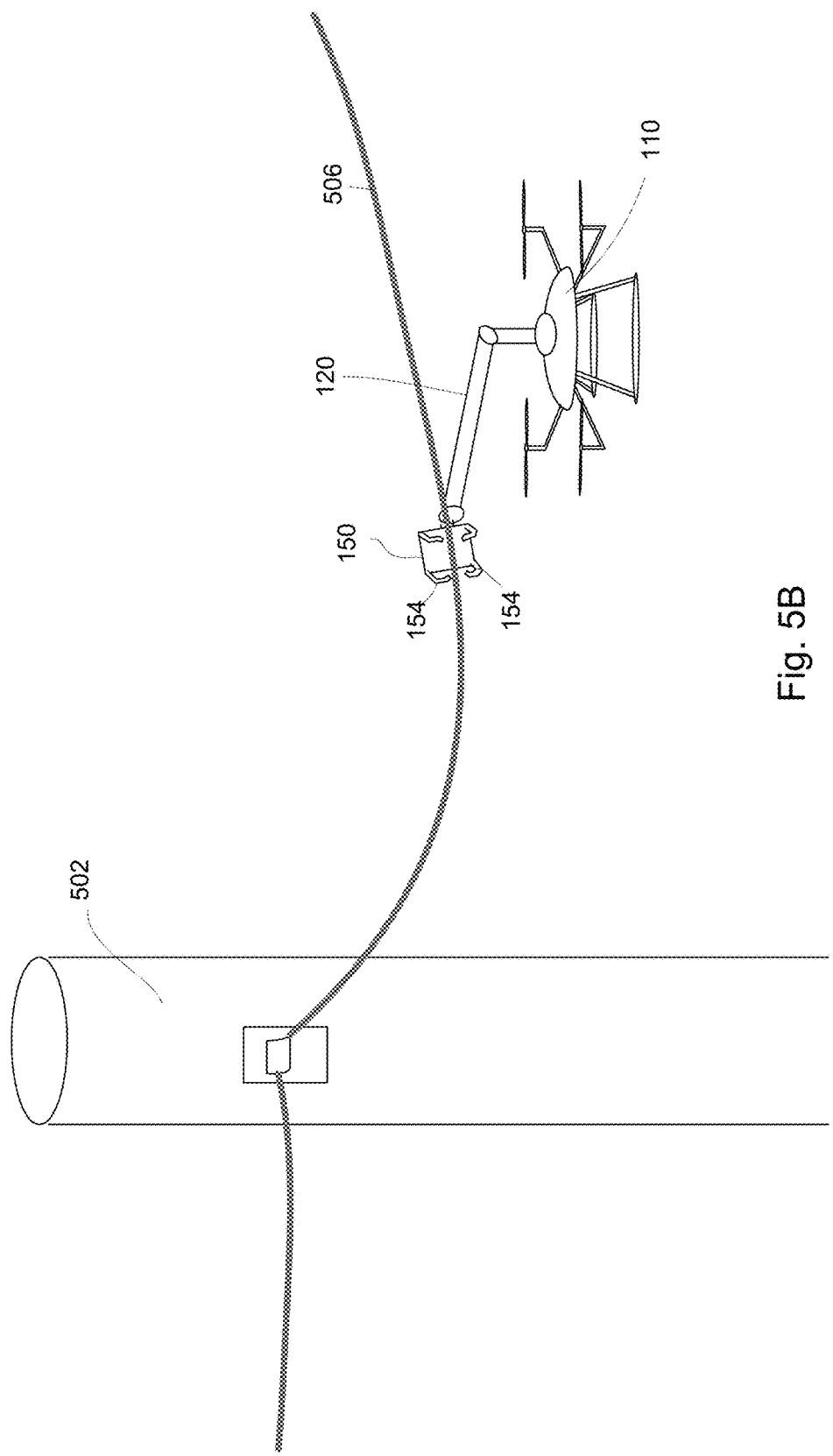

The ability of the aerial inspection system 100 to continually adjust its position with respect to the cable 504 enables the aerial inspection system to closely inspect stretches of cable that do not extend substantially horizontally, without damaging the cable or the aerial inspection system. An example is illustrated in FIG. 5B. Cable 506 is supported by pole 502, but has a considerable amount of slack, causing the cable 506 to droop. As the end effector 150 continually detects a position of the cable 506 and adjusts its own position to maintain a same relative position, the aerial inspection system adapts to the changes in linearity of the cable 506.

In addition to adapting position to the cable, the aerial inspection system may also adjust position to account for other events, such as wind gusts that move the UAV.

FIG. 6 illustrates an example of a failsafe operation performed by the aerial inspection system. In this example, the end effector 150 grasps onto the cable 604, to prevent damage to the aerial inspection system or the cable 604. Such failsafe operation may be performed if, for example, the apparatus experiences an unexpected change in position. For example, an exceptionally strong wind gusts may move the apparatus beyond limits which can be tolerated and adjusted for by the aerial inspection system. In response to detecting such extreme position change, the end effector 150 may automatically grasp the cable 604. For example, a distal end of each of the tongs of the end effector 150 may move towards one another to close around the cable. As another example, the aerial inspection system may move so as to hook at least one tong around the cable 604, regardless of whether or not the tongs are moveable.

This latching onto the cable 604 by the end effector 150 makes the aerial inspection system less likely to become entangled in cables, collide with pole 604, or otherwise cause damage to the aerial inspection system or the cable. Unexpected position changes may only be one type of event that triggers operation of failsafe mode. Other events may include, for example, contacting the cable, loss of power, equipment malfunction, etc. Moreover, other operations may be performed by the aerial inspection system as part of a failsafe mode. Examples of such other operations include error reporting, saving data to a particular location, implementation of additional procedures, pausing of other procedures, etc.

Figure 7B:
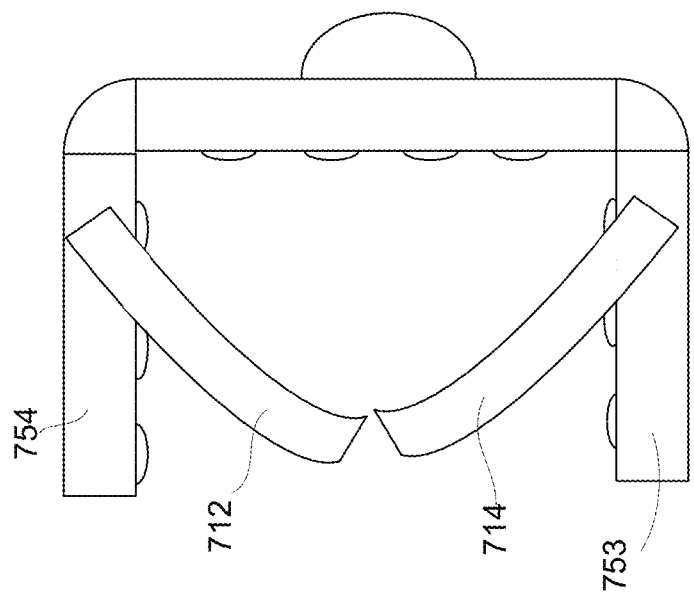
FIGS. 7A-7B illustrate an example latching mechanism according to aspects of the disclosure.
Figure 7A:
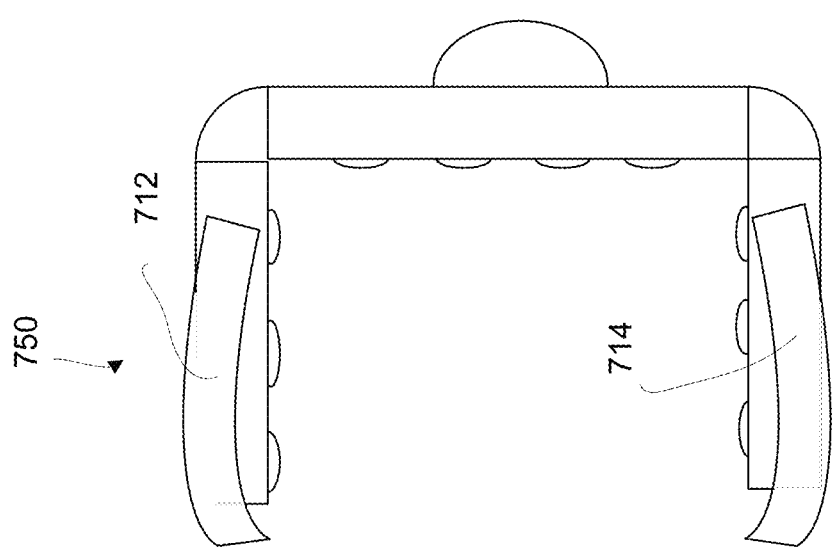

FIG. 7A illustrates an example end effector 750 having a latching mechanism which may be used to grab a cable in a failsafe mode, as described above. In this example, latches 712, 714 may be positioned on one or more tongs of the end effector 750. These latches 712, 714 may be coupled to a hinge or joint and locked in a first position, where the latches 712, 714 would not interfere with inspection of cables by the end effector 750. However, the latches 712, 714 may be released in response to a failsafe condition. For example, the latches 712, 714 may be springloaded, such that once they become unlocked from the first position, they spring to a second position, as shown in FIG. 7B. In this second position, the latches 712, 714 extend towards each other, and in cooperation with end effector tongs 753, 754, create a substantial closure of the end effector around the cable. Accordingly, the end effector may latch onto the cable if necessary. While a spring loaded release mechanism is described above, it should be understood that any mechanism is possible. Actuation of the latching mechanism may in other examples be motorized and controlled by one or more processors. Moreover, while the latches 712, 714 are illustrated as substantially elongated curved segments in FIGS. 7A-7B, any of a number of designs are feasible.

As mentioned above, the aerial inspection system may include a computing device which receives positive feedback from the components on the end effector and in response adjusts a position of the UAV, arm, and/or end effector to maintain a close, non-contact position with respect to the target aerial cable. According to one example, one processor controls operation of the arm and the end effector, while another processor controls operation of the UAV. These two processors may be in communication with one another, for example, such that the end effector processor provides feedback to the UAV processor to maintain a stable position of the UAV relative to the target cable, and to aid in navigation and collision avoidance. In another example, the same one or more processors control operation of both the arm/end effector and the UAV.

Figure 8:
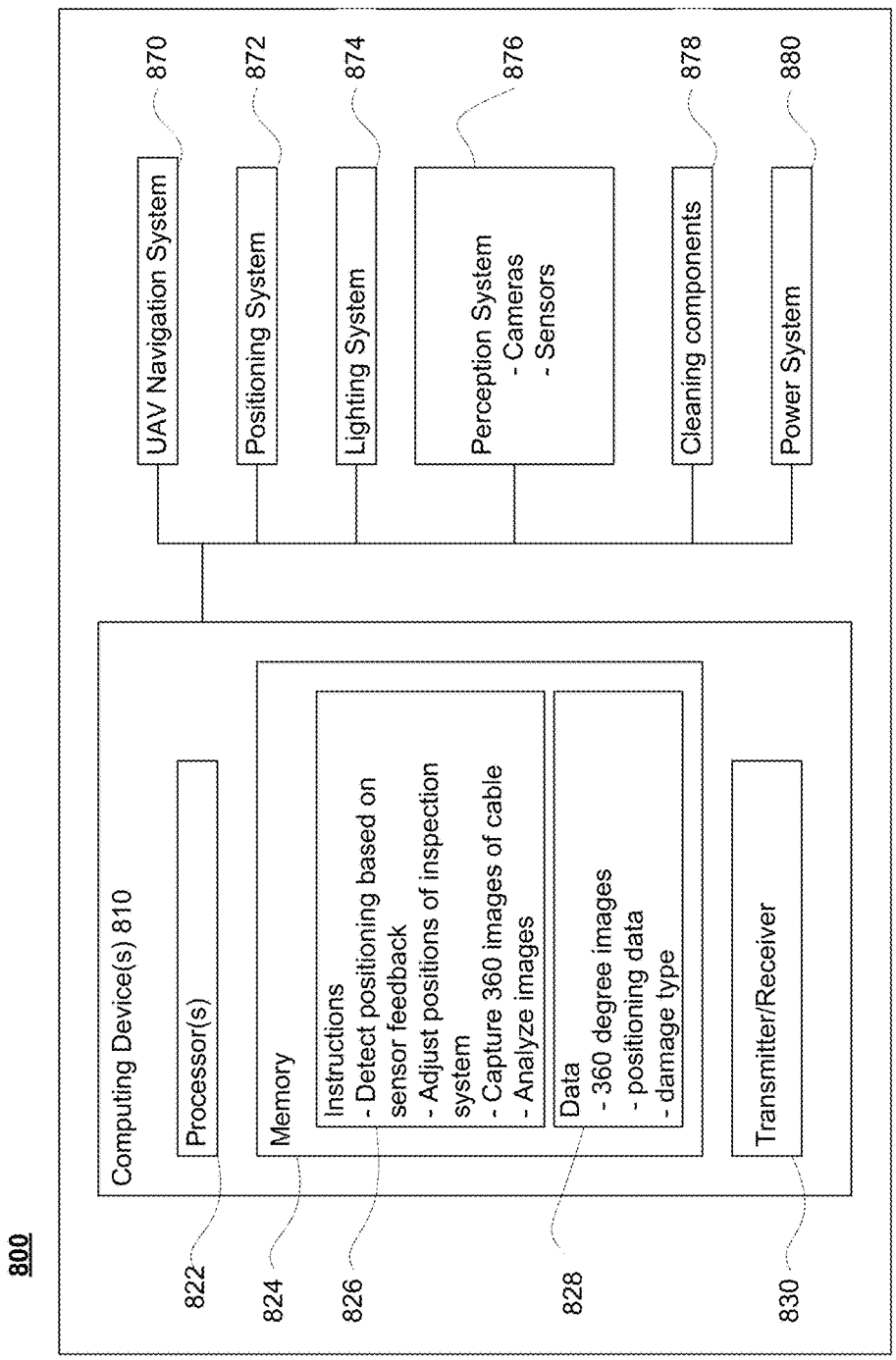
FIG. 8 is a block diagram of an example computing device according to aspects of the disclosure.

An example system is illustrated in FIG. 8. As shown, the system 800 includes one or more computing devices 810 coupled to various components 870-880, such as UAV navigation system 870, positioning system 872, lighting 874, perception system 876, cleaning components 878, and power system 880. The computing device 810 further includes one or more processors 822, memory 824, and other components typically present in microprocessors, general purpose computers, or the like.

The one or more processor 822 may be any conventional processors, such as commercially available microprocessors. Alternatively, the one or more processors may be a dedicated device such as an application specific integrated circuit (ASIC) or other hardware-based processor. Although FIG. 8 functionally illustrates the processor, memory, and other elements of computing device 810 as being within the same block, it will be understood by those of ordinary skill in the art that the processor, computing device, or memory may actually include multiple processors, computing devices, or memories that may or may not be stored within the same physical housing. Similarly, the memory may be a hard drive or other storage media located in a housing different from that of computing device 810. Accordingly, references to a processor or computing device will be understood to include references to a collection of processors or computing devices or memories that may or may not operate in parallel.

Memory 824 may store information that is accessible by the processors 822, including instructions 826 that may be executed by the processors 822, and data 828. The memory 824 may be of a type of memory operative to store information accessible by the processors 822, including a non-transitory computer-readable medium, or other medium that stores data that may be read with the aid of an electronic device, such as a hard-drive, memory card, read-only memory ("ROM"), random access memory ("RAM"), digital versatile disc ("DVD") or other optical disks, as well as other write-capable and read-only memories. The subject matter disclosed herein may include different combinations of the foregoing, whereby different portions of the instructions 826 and data 828 are stored on different types of media.

Data 828 may be retrieved, stored or modified by processors 822 in accordance with the instructions 826. For instance, although the present disclosure is not limited by a particular data structure, the data 828 may be stored in computer registers, in a relational database as a table having a plurality of different fields and records, XML documents, or flat files. The data 828 may also be formatted in a computer-readable format such as, but not limited to, binary values, ASCII or Unicode. By further way of example only, the data 828 may be stored as bitmaps comprised of pixels that are stored in compressed or uncompressed, or various image formats (e.g., JPEG), vector-based formats (e.g., SVG) or computer instructions for drawing graphics. Moreover, the data 828 may comprise information sufficient to identify the relevant information, such as numbers, descriptive text, proprietary codes, pointers, references to data stored in other memories (including other network locations) or information that is used by a function to calculate the relevant data.

In one example, computing device 810 may be an autonomous cable inspection computing system incorporated into system 800, such as a UAV having a robotic extension arm and end effector. The computing device may capable of communicating with various components of the system autonomously, or without continuous input from a human operator. For example, computing device 810 may be in communication with various components 870-880 of the system 800, which operate in accordance with the instructions 826 of memory 824 in an autonomous mode which does not require or need continuous or periodic input from an operator. Although these systems are shown as external to computing device 810, in other examples these systems may also be incorporated into computing device 810.

The instructions 826 may be executed to perform various cable inspection operations using one or more of the components 870-880 or other components not shown. For example, the UAV navigation system 870 may include a GPS or other system which directs the UAV to a stretch of cable to be inspected. The positioning system 872 may be instructed to respond to feedback provided by the perception system 876, which may include one or more cameras, sensors, etc. For example, the positioning system 872 may include one or more motors or other devices used to control positioning of the UAV, the extension arm, and/or the end effector. As the perception system 876 provides data regarding a proximity of the cable to the end effector, the positioning system 872 may adjust a position of one or more of the UAV, arm, or end effector so as to maintain a position where the end effector at least partially surrounds the cable in close proximity Lighting system 874 may include one or more LEDs or other devices. The lighting system 874 may be instructed to illuminate a cable being inspected any time the UAV is within a predetermined distance from the cable, when environmental conditions are such that natural light is insufficient, or under any other circumstances. In this regard, the lighting system 874 may also be responsive to input from the perception system 876, such as feedback from light or proximity sensors. Similarly, cleaning components 878 may also respond to feedback from the perception system 876. For example, the one or more processors 822 may determine, based on images captured by the perception system 876, that the cable being inspected is dirty. As such dirt may be obstructing information, such as manufacturer information printed on the cable jacket, the cleaning components 878 may be instructed to spray water or air or perform some other operation to clear the debris. The power system 880 may include, for example, a battery for powering the system 800.

While the components 870-880 are described above in reference to an example of an autonomous cable inspection mode, it should be understood that the components may also operate in response to operator input or other instructions. For example, the computing device 810 may provide information to a remote computing device, such as an operator control unit, through transmitter/receiver 830. Likewise, the computing device 810 may receive instructions from the remote operator control unit. In other examples, the system 800 may operate in an autonomous cable inspection mode, but still provide feedback to a remote computing device using the transmitter/receiver 830.

Figure 9:
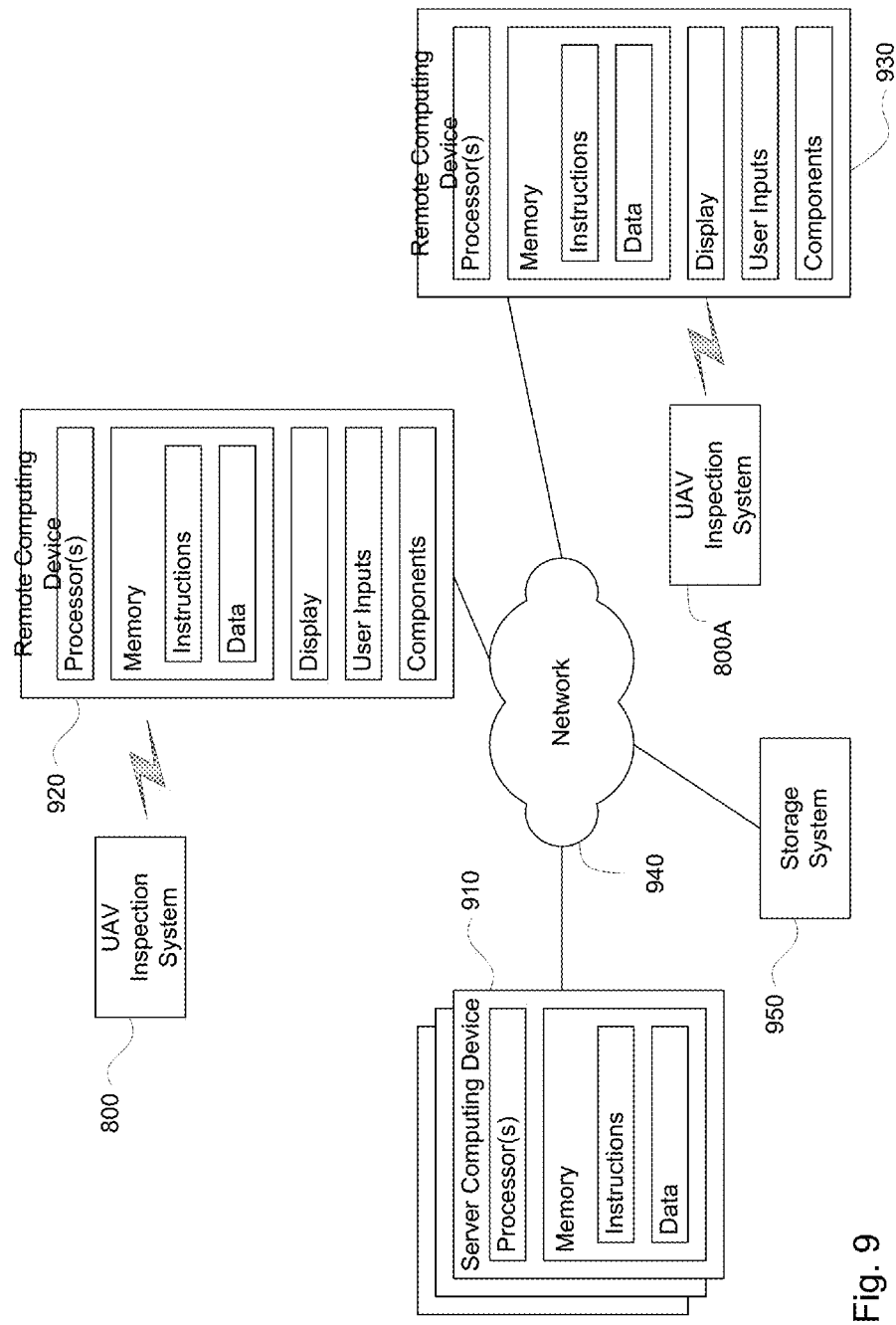
FIG. 9 is a block diagram of an example system according to aspects of the disclosure.

FIG. 9 illustrates an example system 900, where the UAV and cable inspection system 800 communicates with other devices. For example, UAV inspection systems 800, 800A may each communicate with a remote computing device 920, 930 via wireless communication methods, such as Bluetooth, radio frequency signals, or the like. The remote computing devices 920, 930 may be, for example, mobile devices such as PDAs, laptops, netbooks, tablet computing devices, head mounted displays, etc., or desktop devices. Each remote computing device 920, 930 may include, for example, a processor, memory, display, user input, communication components, etc. The remote computing device 920, 930 may receive feedback from the UAV systems 800, 800A as described above, such as receiving 360 degree images of aerial cables. The remote computing devices 920, 930 may further provide instructions to the UAV systems 800, 800A, such as where to go or operations to take with respect to a particular cable.

In this example, the remote computing devices 920, 930 are coupled to a centralized server 910 and storage system 950 through network 940. The server 910 may collect information from a number of UAV systems and use such information to improve the operation of the UAV systems. For example, 360 degree images captured by each UAV system may be stored in the storage system 950. Objects in the images, such as types of damage, may be identified using any of a number of techniques, and an indication of such objects may be stored in association with the images. Such information may be accessed by the UAV systems 800, 800A in inspecting cable, assessing damage, and potentially in repairing the damage.

While in the example of FIG. 9 the systems 800, 800A are shown as being connected to the network 940 through remote computing devices 920, 930, it should be understood that in other examples, the systems 800, 800A may be directly connected to the network 940. Network 940, and intervening nodes, may include various configurations and protocols including the Internet, World Wide Web, intranets, virtual private networks, wide area networks, local networks, private networks using communication protocols proprietary to one or more companies, Ethernet, WiFi (e.g., 802.11, 802.11b, g, n, or other such standards), HTTP, and various combinations of the foregoing. Such communication may be facilitated by a device capable of transmitting data to and from other computers, such as modems (e.g., dial-up, cable or fiber optic) and wireless interfaces.

Although certain advantages are obtained when information is transmitted or received as noted above, other aspects of the subject matter disclosed herein are not limited to a particular manner of transmission of information. For example, in some aspects, information may be sent via a medium such as a disk, tape or CD ROM.

Examples Methods

Figure 10:
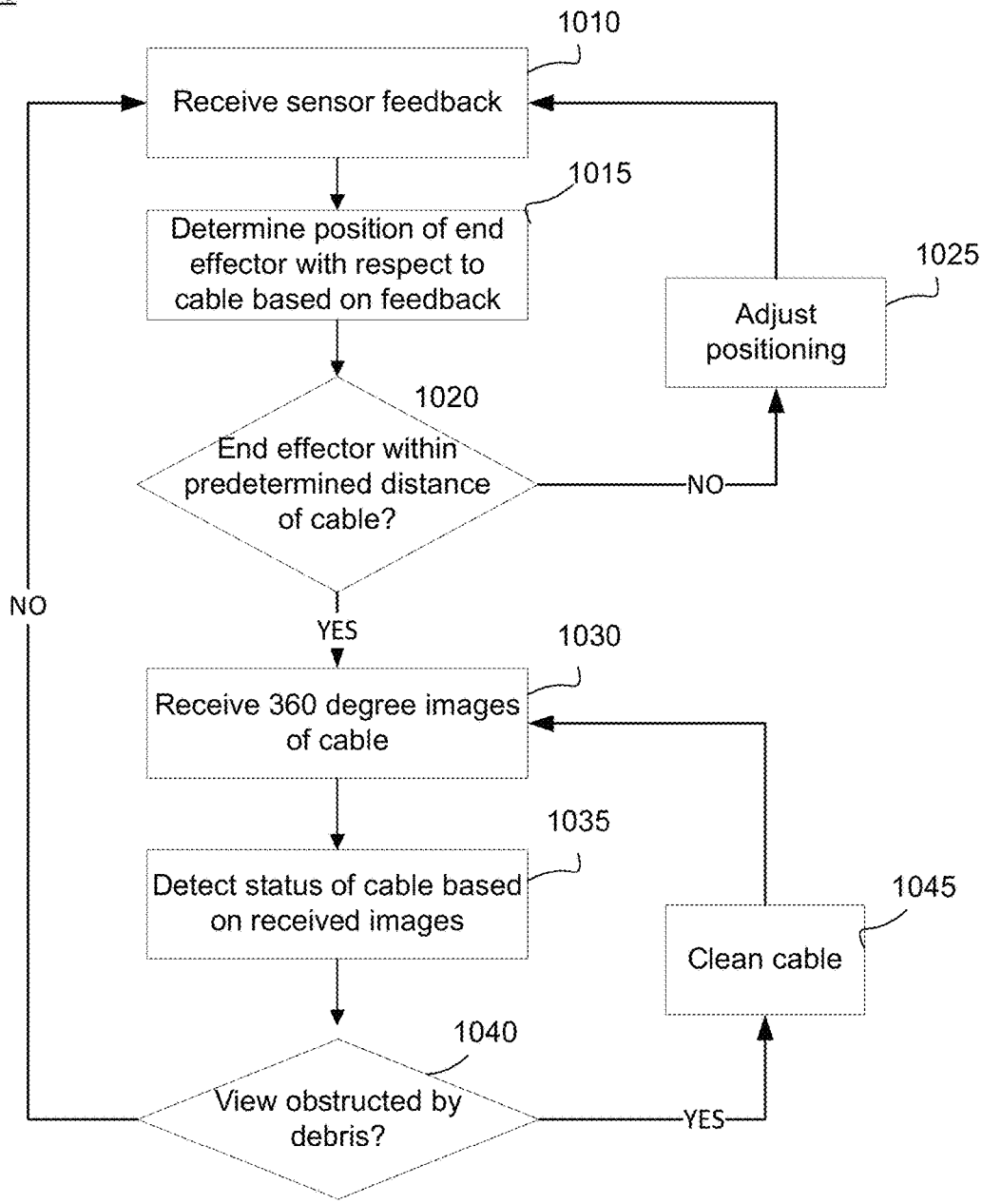
FIG. 10 is a flow diagram illustrating an example method according to aspects of the disclosure.

FIG. 10 illustrates an example method 1000 of inspecting aerial cable according to aspects of the disclosure. The method may be performed with, for example, a UAV including an end effector coupled thereto via an articulated arm. While parts of the method are discussed in a particular order below, it should be understood that these parts may be performed in a different order. Similarly, operations may be performed simultaneously, some operations may be omitted, and other operations may be added.

In block 1010, sensor feedback is received at one or more processors. The sensors providing the feedback are positioned on an end effector coupled to a UAV via an articulated arm. The sensors may include, for example, proximity sensors, light sensors, heat sensors, radiation sensors, acoustic transducers, or any other type of sensors. In one example, the sensors continually provide feedback, even when other functions are being performed.

At block 1015, a position of the end effector is determined relative to the aerial cable being inspected. The positioning is determined using at least the received feedback.

At block 1020, it is determined whether the end effector is within a predetermined distance of the cable. For example a distance between an outer periphery of the cable and an inner surface of the end effector may be measured at one or more points. This distance may be compared to a predetermined range, such as 10 mm-100 mm, to determine whether the end effector is at least partially surrounding the cable, or whether it is too close or far away.

If the end effector is determined to not be within the predetermined distance, positioning is adjusted in block 1025. For example, a position of the end effector, the arm, the UAV, or any combination of these may be adjusted. The method 1000 may then return to block 1010.

If, however, the end effector is determined to be within an appropriate distance of the cable, such that the end effector is at least partially surrounding the cable and in close proximity, the method proceeds to block 1030. Here, 360 degree images, captured using image capture devices on the end effector, are received. These images may be analyzed and stored.

In block 1035, the received images are used to detect a status of the aerial cable. For example, the images may be used to identify damage to the aerial cable. Such detection may include object recognition techniques, image comparison techniques, or any of a number of other techniques.

In block 1040, it may be determined whether a view of the cable is obstructed by debris. This determination may be based on the analysis of the 360 degree images, or from other information received from the sensors.

If the view of the cable is obstructed by debris, the cable may be cleaned in block 1045. For example, the end effector may include cleaning components, such as compressed air or water mist, that may be activated to clear the debris. According to one example, the cleaning components may dispense a predetermined amount of air or water before reviewing subsequent images, and may continue this dispense and review cycle until the cable is clean or until a predetermined number of cycles have been executed.

Examples Implementations

The subject matter described herein may be used in any of a number of different situations. As one example, the aerial inspection system described above may be used in responding to outside plant (OSP) network (Layer 1) service disrupting events. With assistance from proprietary network outage monitoring systems and network infrastructure geographic information systems (GIS), the apparatus may be rapidly dispatched from a secure base facility to the affected area. The autonomous cable inspection system enables the operations center personnel to quickly assess the situation, identify the level of network damage, and dispatch the appropriate resources. The aerial inspection system may be programmed to automatically return to the base facility for maintenance and charging in response to predetermined events, such as a detection of a low battery level, a need for repairs, or completion of a specified job.

With a direct flight path to the outage area, the UAV can arrive on location far ahead of any technician that is not already in the outage area and having to commute by roadway through traffic. This enables the inspection system along with operations center personnel to quickly begin searching for any physical damage to the aerial network cables.

If it is discovered that the network event has been caused by an accident, such as a pole impacted by vehicle, aerial cables impacted by a crane, etc., and there may be personal injuries, the appropriate emergency services could be immediately notified by the UAV.

Upon arriving on scene, the technician can take control of the UAV inspection system, if desired, directing its actions to determine next steps in the troubleshooting process. With the real-time inspection data indicating conclusive damage results, the technician could begin performing the necessary network repairs while the UAV inspection system returns to its base facility. Alternatively, the UAV inspection system could also be deployed in a semi-autonomous mode by an onsite outage restoration technician to assist in locating difficult to find physical damage to the aerial cables.

As another example implementation, the UAV inspection system may be used for autonomous maintenance inspections, such as surveying and examining miles of aerial cable. For example, autonomous maintenance inspections can be performed by a regional operator or in a semi-autonomous mode by an onsite operator providing line-of-sight commands While performing an inspection of aerial cable lines, the inspection system can identify fiber cables via special QR code tags or labels. The end-effector sensors are capable of providing a very detailed examination of the condition of the outer cable jacket and distinguish various types of damage, such as squirrel damage, vandalism, etc.

In addition, while inspecting for damage, any printed information, such as footage tic marks, manufacturer information, lot number, etc. on the outer jacket can be read and with optical character recognition (OCR) technology and be recorded in a network database. Aerial storage locations and quantities can be accurately identified.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. The examples and other arrangements may be devised without departing from the spirit and scope of the subject matter defined by the appended claims. Further, the same reference numbers in different drawings can identify the same or similar elements.

The invention claimed is:

1. A system, comprising:
one or more sensors;
a memory; and
one or more processors in communication with the one or more sensors and the memory, the one or more processors configured to:
receive input from the one or more sensors;
detect, based on the received input, a proximity between an end effector of an unmanned aerial vehicle and an aerial cable; and
adjust a position of the end effector with respect to the aerial cable in response to the received input, such that the end effector at least partially surrounds an outer diameter of the aerial cable, and the outer diameter of the aerial cable remains at a distance of approximately 1-100 mm from each surrounding portion of the end effector.

2. The system of claim 1, wherein the one or more processors are further configured to:
detect a failure event, the failure event including at least one of a power failure, a communication failure, or an unexpected position change; and
cause the end effector of the aerial vehicle to latch onto the aerial cable in response to detecting the failure event.

3. The system of claim 1, further comprising one or more image capture devices in communication with the one or more processors, the one or more image capture devices adapted to capture an image of 360 degrees around an outer perimeter of the aerial cable at any given time.

4. The system of claim 3, wherein the one or more processors are further configured to:

store the captured image in the memory;
receive input from a remote device, the input corresponding to an object in the stored captured image;
store the received input in association with the stored captured image;
compare the stored captured image to one or more subsequently captured images;
access the received input corresponding to the stored captured image; and
take an action with respect to the one or more subsequently captured images based on the accessed received input.

5. The system of claim 1, wherein the adjusting the position of the end effector comprises adjusting a position of the unmanned aerial vehicle.

6. The system of claim 1, wherein the adjusting the position of the end effector comprises manipulating an articulated arm coupled between the end effector and the unmanned aerial vehicle, the articulated arm having at least seven degrees of freedom.

7. A method, comprising:
continually receiving input from one or more sensors positioned on an end effector coupled to an unmanned aerial vehicle, the input corresponding to an aerial cable;
detecting, with one or more processors, based on the received input, a proximity between the end effector and the aerial cable; and
continually adjusting, with the one or more processors, a position of the end effector with respect to the aerial cable in response to the received input, such that the end effector at least partially surrounds an outer diameter of the aerial cable, and the outer diameter of the aerial cable remains at a distance of approximately 1-100 mm from each surrounding portion of the end effector.

8. The method of claim 7, further comprising:
detecting a failure event, the failure event including at least one of a power failure, a communication failure, or an unexpected position change; and
causing the end effector of the aerial vehicle to latch onto the aerial cable in response to detecting the failure event.

9. The method of claim 7, further comprising capturing, using one or more image capture devices in communication with the one or more processors, an image of 360 degrees around an outer perimeter of the aerial cable.

10. The method of claim 9, further comprising:
storing the captured image in a memory;
receiving input from a remote device, the input corresponding to an object in the stored captured image;
storing the received input in association with the stored captured image;
comparing the stored captured image to one or more subsequently captured images;
accessing the received input corresponding to the stored captured image; and
taking an action with respect to the one or more subsequently captured images based on the accessed received input.

11. The method of claim 7, wherein the adjusting the position of the end effector comprises adjusting a position of the unmanned aerial vehicle.

12. The method of claim 7, wherein the adjusting the position of the end effector comprises manipulating an articulated arm coupled between the end effector and the unmanned aerial vehicle, the articulated arm having at least seven degrees of freedom.

\* \* \* \* \*